United States Patent
Matsuzaki et al.

(10) Patent No.: US 9,159,622 B2
(45) Date of Patent: Oct. 13, 2015

(54) DIVIDING METHOD FOR WAFER

(71) Applicants: DISCO CORPORATION, Tokyo (JP); IWATANI CORPORATION, Osaka-shi (JP)

(72) Inventors: Sakae Matsuzaki, Tokyo (JP); Takatoshi Masuda, Tokyo (JP); Nozomi Maemoto, Tokyo (JP); Yu Yoshino, Amagasaki (JP); Takehiko Senoo, Osaka (JP); Toshihiro Aida, Tokyo (JP); Tomoya Biro, Tokyo (JP)

(73) Assignee: Disco Corporation, Tokyo (JP)

(*) Notice: Subject to any disclaimer, the term of this patent is extended or adjusted under 35 U.S.C. 154(b) by 0 days.

(21) Appl. No.: 14/454,136

(22) Filed: Aug. 7, 2014

(65) Prior Publication Data

US 2015/0044857 A1 Feb. 12, 2015

(30) Foreign Application Priority Data

Aug. 7, 2013 (JP) .................. 2013-164095

(51) Int. Cl.
*H01L 21/78* (2006.01)
*H01L 21/268* (2006.01)
*H01L 21/3065* (2006.01)

(52) U.S. Cl.
CPC ............ *H01L 21/78* (2013.01); *H01L 21/2686* (2013.01); *H01L 21/3065* (2013.01)

(58) Field of Classification Search
CPC ....... H01L 21/027; H01L 21/56; H01L 21/78; H01L 21/6835–21/6836

USPC ................... 438/114, 460–464, E21.502, 514
See application file for complete search history.

(56) References Cited

U.S. PATENT DOCUMENTS

| | | | | |
|---|---|---|---|---|
| 5,776,798 A | * | 7/1998 | Quan et al. ..................... | 438/112 |
| 6,342,434 B1 | * | 1/2002 | Miyamoto et al. ............ | 438/464 |
| 6,730,579 B1 | * | 5/2004 | Sasaka .......................... | 438/464 |
| 7,064,010 B2 | * | 6/2006 | Farnworth et al. ............ | 438/114 |
| 8,883,614 B1 | * | 11/2014 | Lei et al. ....................... | 438/460 |
| 8,883,615 B1 | * | 11/2014 | Holden et al. ................. | 438/462 |
| 2005/0167800 A1 | * | 8/2005 | Naya ............................. | 257/678 |
| 2006/0292877 A1 | * | 12/2006 | Lake ............................. | 438/694 |
| 2010/0129984 A1 | * | 5/2010 | Vakanas et al. ............... | 438/463 |
| 2013/0244404 A1 | * | 9/2013 | Van der Stam et al. ....... | 438/462 |
| 2014/0106542 A1 | * | 4/2014 | Chowdhury et al. ......... | 438/462 |
| 2014/0205816 A1 | * | 7/2014 | Maejima ....................... | 428/200 |
| 2014/0213041 A1 | * | 7/2014 | Lei et al. ....................... | 438/462 |

FOREIGN PATENT DOCUMENTS

| | | |
|---|---|---|
| JP | 2005-252126 | 9/2005 |
| JP | 2009-111147 | 5/2009 |

\* cited by examiner

*Primary Examiner* — Michael Lebentritt
(74) *Attorney, Agent, or Firm* — Greer Burns & Crain Ltd.

(57) ABSTRACT

A dividing method for a wafer includes a step of irradiating a laser beam along streets to form modified regions in an inside of a wafer, a step of dividing the wafer into individual chips beginning with starting points given by the modified regions, a step of placing a processing chamber in which the wafer is charged to a vacuum state and fill the processing chamber with inert gas, and a step of introducing etching gas into the processing chamber filled with the inert gas to etch side faces of the chips.

2 Claims, 6 Drawing Sheets

DIVIDING METHOD FOR WAFER

BACKGROUND OF THE INVENTION

1. Field of the Invention

The present invention relates to a dividing method for a wafer by which a semiconductor wafer is divided along a street.

2. Description of the Related Art

A semiconductor wafer is partitioned into a large number of rectangular regions with streets (planned dividing lines) arrayed in a lattice pattern and are divided into individual chips along the streets. Conventionally, as a dividing method for a wafer, a method of dividing a wafer into individual chips by combination of SD (Stealth Dicing) and expansion (refer to, for example, Japanese Patent Laid-Open No. 2005-252126 and Japanese Patent Laid-Open No. 2009-111147). In the SD, a laser beam is irradiated along a street to form a modified region, which becomes a starting point of division, in a wafer. In the expansion, a tape pasted to a wafer is expanded so that external force is applied to a modified region to divide the wafer along a street.

Meanwhile, in the dividing method for a wafer disclosed in Japanese Patent Laid-Open No. 2005-252126 and Japanese Patent Laid-Open No. 2009-111147, since tensile force is applied to a modified region in which a strength decreases so that the wafer is broken at the modified region, if a crack appears on a side face (dividing face) of a chip, then very small broken pieces scatter. Further, if a modified region having reduced strength remains on a side face of a chip after broken, then part of the modified region sometimes comes off and further scatters as a broken piece to ambient. Since such a crack or very small broken piece has a bad influence on a performance of a chip, etching gas is used to remove a modified region, a crack and a broken piece to smoothen a side face of a chip.

SUMMARY OF THE INVENTION

However, in the dividing method for a wafer disclosed in Japanese Patent Laid-Open No. 2005-252126 and Japanese Patent Laid-Open No. 2009-111147, since only a side face of a chip is etched and besides gas penetrates into a crack on a side face of a chip, there is a disadvantage that etching progresses in a crack to cause the crack to grow.

Therefore, it is an object of the present invention to provide a dividing method for a wafer by which a modified region or a broken piece remaining on a side face of a chip can be removed while growth of a crack is suppressed.

In accordance with an aspect of the present invention, there is provided a dividing method for a wafer including a modified region forming step of irradiating, on a work unit including a dicing tape pasted to a wafer having a plurality of chips formed in a state partitioned from each other by streets on a surface thereof, a laser beam having a wavelength which passes through the wafer along the streets to form modified regions in an inside of the wafer, a dividing step of applying external force to the work unit after the modified region forming step to divide the wafer into the chips along the streets beginning with starting points given by the modified regions and securing a distance between the chips, a process charging step of charging the work unit after having been divided into the chips by the dividing step into a processing chamber and sealing the processing chamber, a vacuum step of placing the processing chamber into which the work unit has been charged and which has been sealed by the process charging step into a vacuum state, an inert gas filling step of introducing inert gas into the processing chamber which has been placed into a vacuum state by the vacuum step to fill the processing chamber with the inert gas by a predetermined pressure and filling the inert gas into division damages existing on chip side faces formed by the dividing step by the pressure of the inert gas, and an etching step of additionally introducing etching gas into the processing chamber which has been filled with the inert gas at the inert gas filling step to perform reactive gas etching for the side faces of the individually divided chips.

With the configuration described above, modified regions are formed in the inside of a wafer along streets, and the wafer is divided into individual chips beginning with starting points given by the modified regions. Then, after the wafer is charged into a processing chamber, the inside of the processing chamber is placed into a vacuum state and inert gas is introduced into the processing chamber. Further, etching gas is additionally introduced into the processing chamber. Consequently, the inert gas is filled into division damages such as cracks existing on chip side faces appearing upon the division, and the chip side faces are etched in a state in which the inert gas remains in the division damages. Therefore, the etching gas does not penetrate into the division damages and the etching progresses in an inward direction (out-of-plane direction) from the chip side faces. Therefore, the modified regions or broken pieces remaining on the chip side faces can be removed while growth of the cracks is suppressed.

Preferably, the processing chamber is configured from a first processing chamber in which the vacuum step and the inert gas filling step are performed in a sealed space and a second processing chamber in which the etching step is performed in a sealed space formed by partitioning the first processing chamber.

With the configuration just described, the etching is carried out in the state in which the inert gas is filled in the division damages such as cracks. Therefore, the modified regions or broken pieces remaining on the chip side faces can be removed while growth of the cracks is suppressed.

The above and other objects, features and advantages of the present invention and the manner of realizing them will become more apparent, and the invention itself will best be understood, from a study of the following description and appended claims with reference to the attached drawings showing a preferred embodiment of the invention.

DETAILED DESCRIPTION OF THE PREFERRED EMBODIMENT

In the following, a dividing method for a wafer according to an embodiment of the present invention is described with reference to the accompanying drawings. A wafer which becomes a processing target is described with reference to FIGS. 1A and 1B. It is to be noted that FIG. 1A is a perspective view of a wafer, and FIG. 1B depicts a perspective view of a work unit wherein a wafer is supported on a ring frame.

Figure 1A:
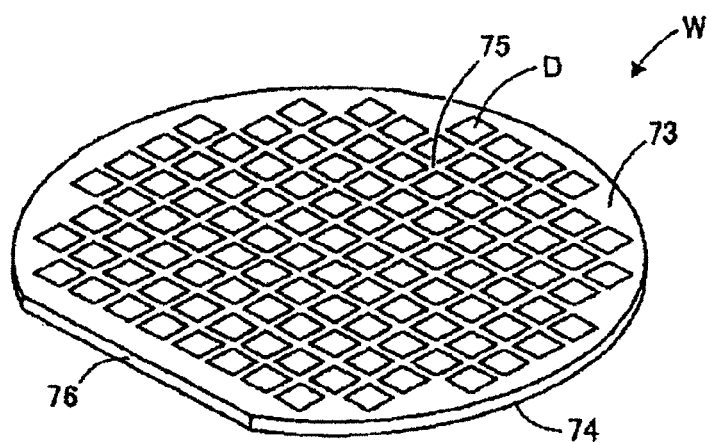
FIG. 1A is a perspective view of a wafer on the front face side.

As depicted in FIG. 1A, a wafer W is formed in a substantially circular shape and is partitioned into a plurality of regions by lattice-like streets 75 arrayed on a front face 73 thereof. In the individual regions, various devices D such as ICs or LSIs which become chips C (refer to FIG. 3C) after they are divided. An orientation flat 76 indicative of crystal orientation is formed on an outer periphery of the wafer W. It is to be noted that, although, in the description of the present embodiment, a semiconductor wafer of silicon, gallium arsenide or the like is taken as an example of the wafer W, the wafer W is not limited to that of the configuration just described. The wafer W may otherwise be an inorganic material substrate, for example, of the ceramic, glass or sapphire ($Al_2O_3$) type, a package of a semiconductor produce or the like.

Figure 1B:
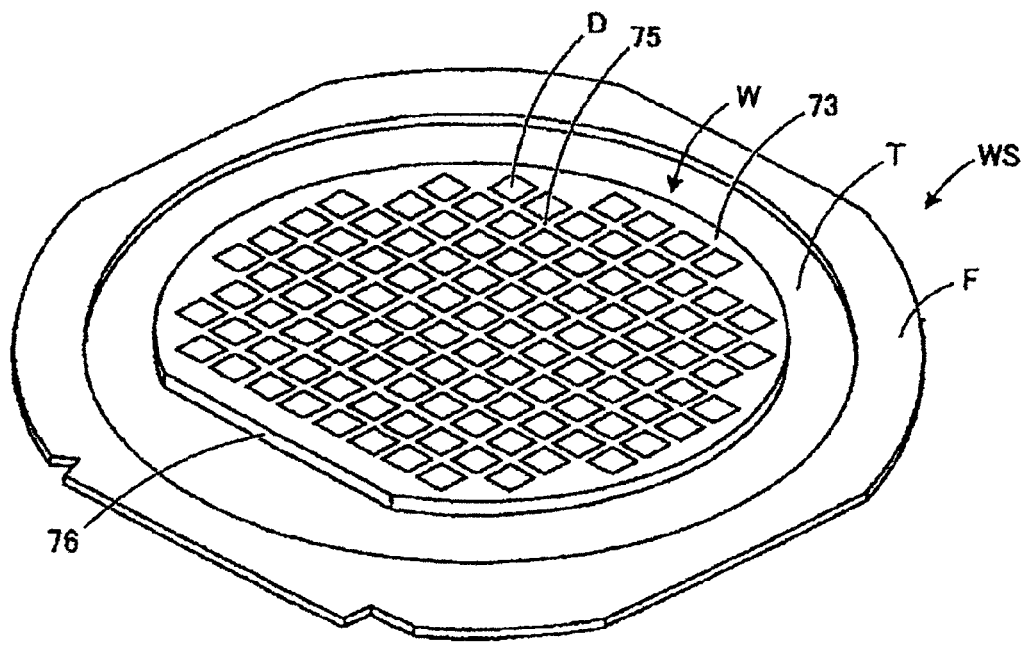
FIG. 1B is a perspective view of a work unit wherein a wafer is supported by a ring frame through a dicing tape.

As depicted in FIG. 1B, a dicing tape T is mounted on a rear face 74 of the wafer W, and a ring frame F is mounted on an outer periphery of the dicing tape T. The wafer W is accommodated as a work unit WS supported on the ring frame F through the dicing tape T in a cassette (not depicted), and is carried into a laser processing apparatus together with the cassette. It is to be noted that, while, in the present embodiment, the dicing tape T is configured so as to be pasted to the rear face 74 of the wafer W, the dicing tape T may otherwise be configured so as to be pasted to the front face 73 of the wafer W.

The work unit WS is processed through a modified region forming step, a dividing step, a process charging step, a vacuum step, an inert gas filling step, and an etching step. At the modified region forming step, modified regions 77 by multiphoton absorption are formed in the inside of the wafer W along the streets 75 by irradiation of a laser beam (refer to FIG. 2). Since a strength of the wafer W drops at the modified regions 77, division starting points are formed in the inside of the wafer W. At the dividing step, external force is applied to the work unit WS, whereupon the wafer W is divided into individual chips C along the streets 75 beginning with starting points given by the modified regions 77 (refer to FIG. 3). On each chip side face 78 after the division, modified regions 77 remain and a crack or cracks 79 (refer to FIG. 6A) appear.

Figure 4A:
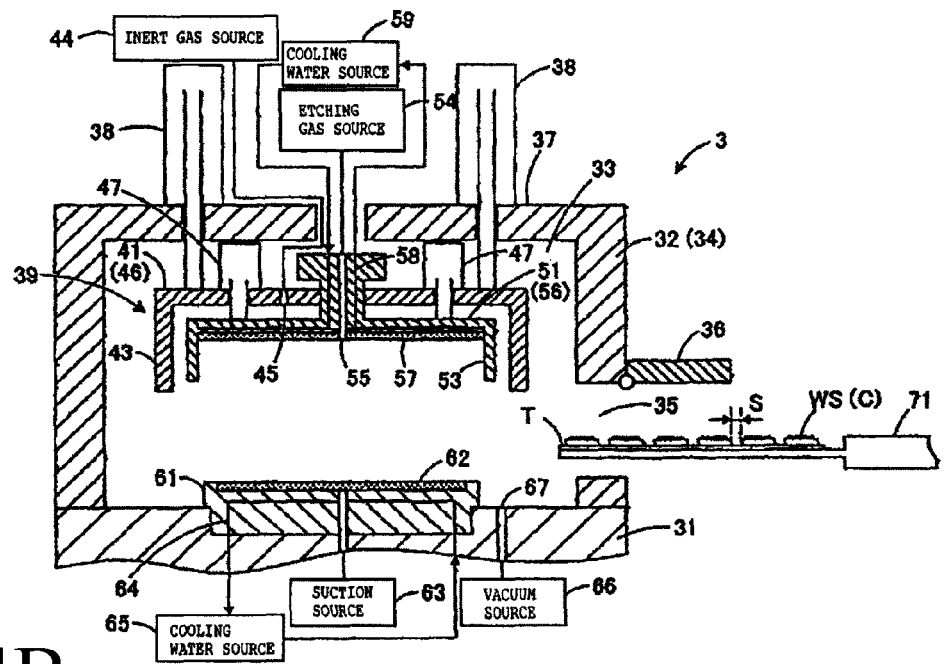
FIG. 4A is a sectional view illustrating a process charging step.

At the process charging step, the work unit WS having been divided into the individual chips C is charged into a processing chamber to be sealed (refer to FIG. 4A). At the vacuum step, the processing chamber into which the work unit WS has been charged is placed into a vacuum state (refer to FIG. 4B). At the inert gas filling step, inert gas is introduced into the processing chamber in the vacuum state, and the inert gas is filled into a crack 79 existing on a chip side face 78 by the pressure of the inert gas (refer to FIGS. 5A and 6A). At the etching step, etching gas is additionally introduced into the processing chamber, and the chip side face 78 is subjected to reactive gas etching (refer to FIGS. 5B and 6B). In this case, since the inert gas is filled in the crack 79, penetration of the etching gas into the crack 79 can be prevented.

Through such a series of steps as described above, the wafer W is divided into individual chips C, and modified regions 77 and broken pieces remaining on the chip side faces 78 after the division are removed appropriately by the etching. Since, upon the etching, penetration of the etching gas into the cracks 79 of the chip side faces 78 is prevented, the chip side faces 78 are etched appropriately while growth of the cracks 79 is suppressed.

Figure 2:
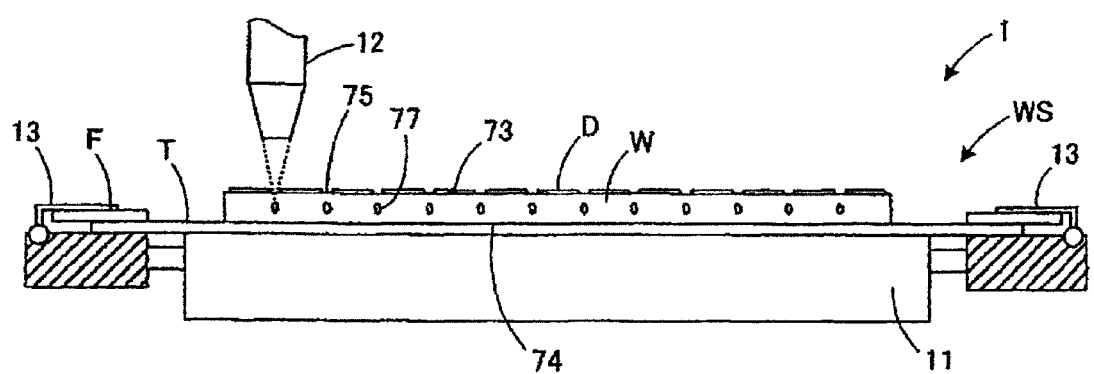
FIG. 2 is a sectional view illustrating a modified region forming step.
Figure 3A:
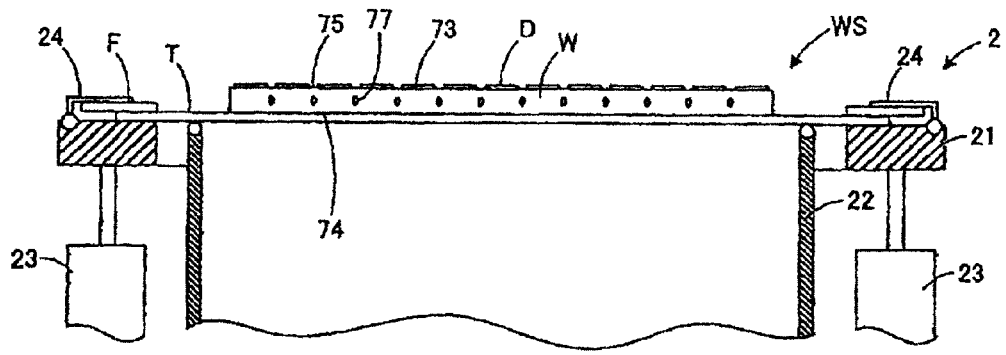
FIGS. 3A and 3B are sectional views illustrating a dividing step.
Figure 4B:
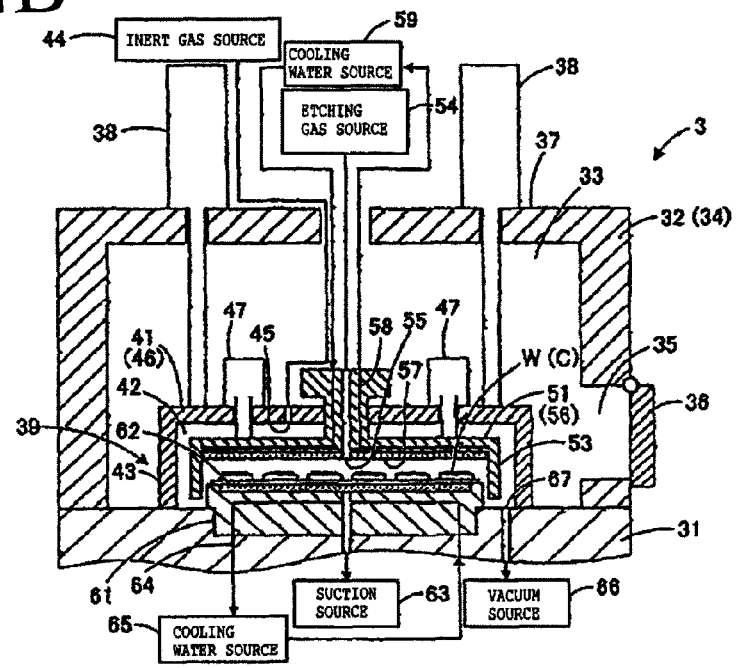
FIG. 4B is a sectional view illustrating a vacuum step.
Figure 5A:
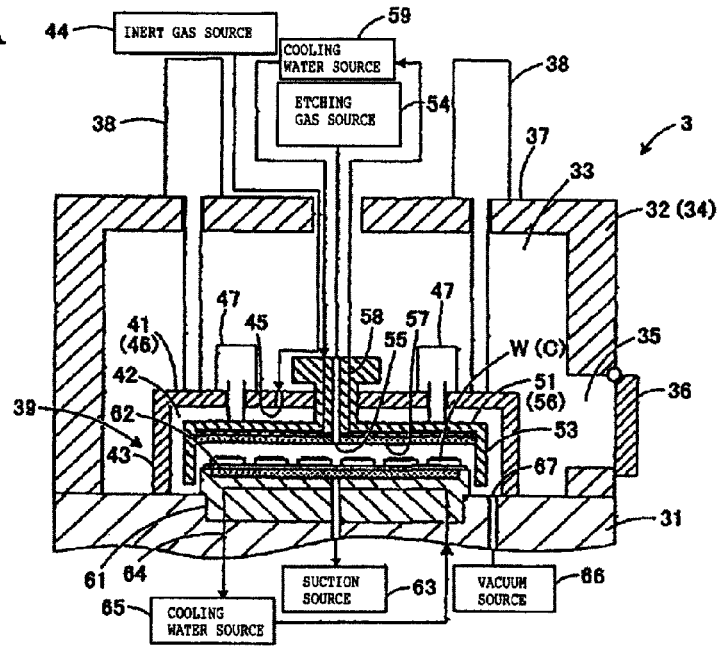
FIG. 5A is a sectional view illustrating an inert gas filling step.
Figure 5B:
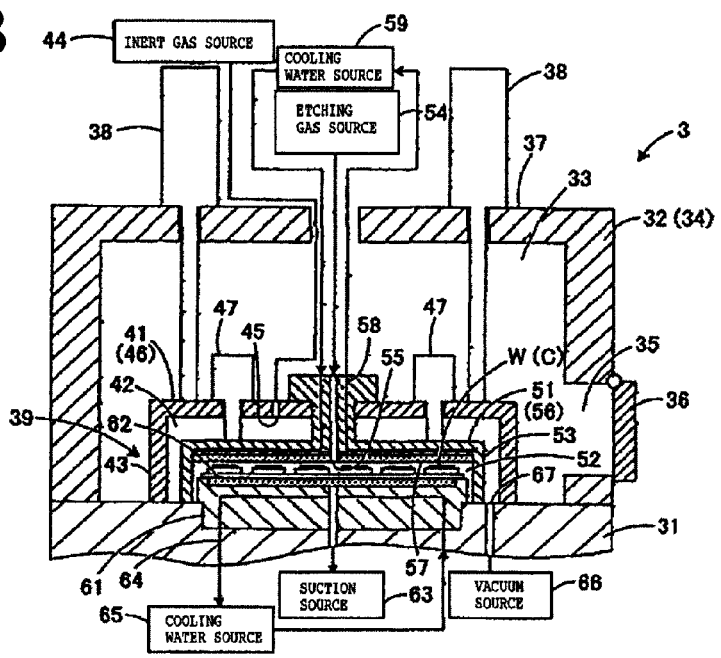
FIG. 5B is a sectional view illustrating an etching step.
Figure 6A:
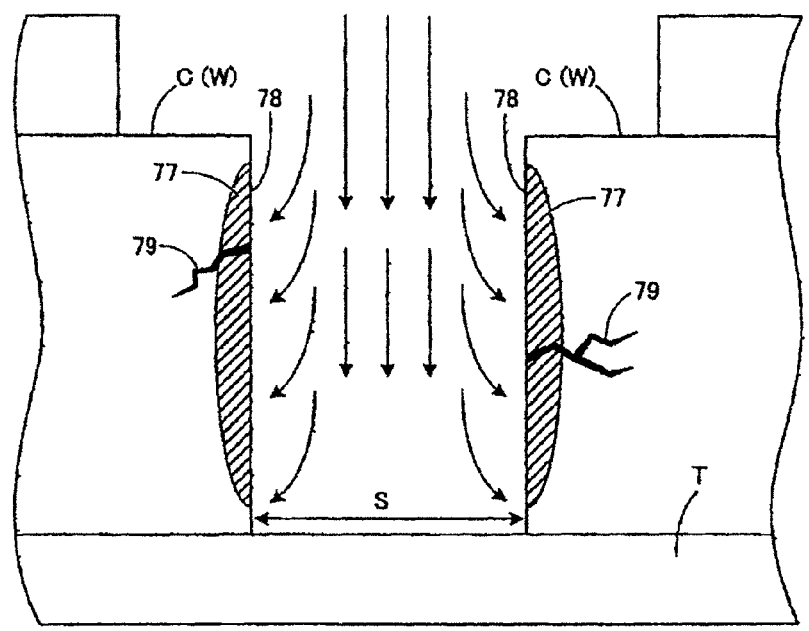
FIG. 6A is a schematic sectional view illustrating the inert gas filling step into a crack.
Figure 6B:
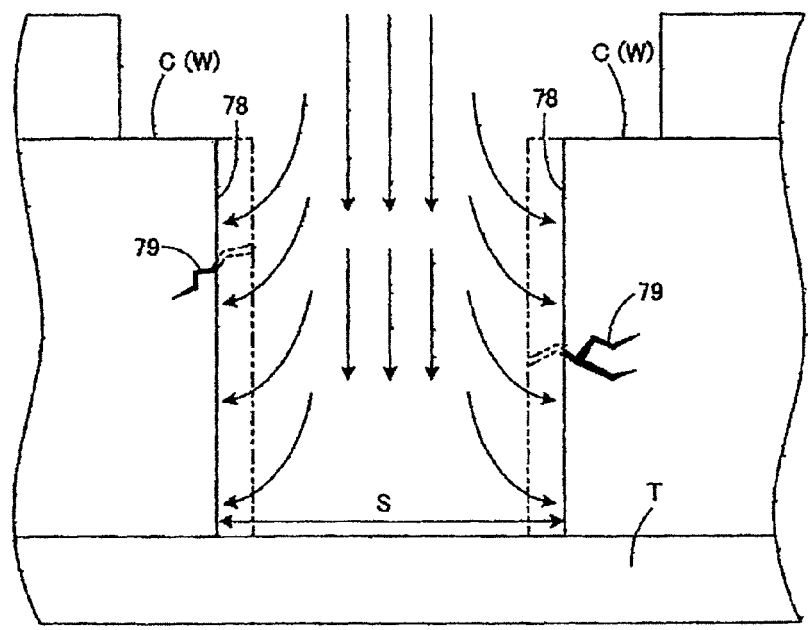
FIG. 6B is a schematic sectional view illustrating the etching step.

In the following, the dividing method for a wafer according to the present embodiment is described in detail with reference to FIGS. 2 to 4B. FIG. 2 illustrates an example of the modified region forming step; FIG. 3 illustrates an example of the dividing step; FIG. 4A illustrates an example of the process charging step; FIG. 4B illustrates an example of the vacuum step; FIG. 5A is an example of the inert gas filling step; and FIG. 5B is an example of the etching step. Further, FIGS. 6A and 6B are explanatory views of an etching state. It is to be noted that, in FIG. 3C, a figure in which an end material on a protective tape is removed is depicted.

In the dividing method for the wafer of the present embodiment, the modified region forming step is carried out first. As depicted in FIG. 2, a laser processing apparatus 1 is configured such that a laser irradiation head 12 is moved relative to a chuck table 11 to carry out laser processing. At the modified region forming step, a work unit WS (wafer W) is held at the rear face 74 thereof on the chuck table 11 with the dicing tape T interposed therebetween and the ring frame F of the work unit WS is held by clamp units 13. Then, an emission opening of the laser irradiation head 12 is positioned at a street 75, and a laser beam of a wavelength having a transparency to the wafer W is irradiated upon the wafer W from the laser irradiation head 12.

While a focal point of the laser beam is adjusted to the inside of the wafer W, the laser irradiation head 12 is moved relative to the wafer W to form a modified region 77 along a street 75 in the inside of the wafer W. In this case, the focal point is first adjusted to the rear face 74 side of the wafer W, and laser processing is carried out such that a lower end portion of the modified region 77 is formed along all of the streets 75. Then, every time the height of the focal point is moved upwardly, the laser processing is repeated along the streets 75 to form the modified regions 77 of a predetermined thickness in the inside of the wafer W. In this manner, division starting points are formed in the inside of the wafer W along all of the streets 75.

It is to be noted that the modified regions 77 are regions in which a density, refractive index, mechanical strength, and other physical properties of the inside of the wafer W are different from those around the regions as a result of irradiation of a laser beam and the strength in the regions is lower than that around the regions. The modified regions 77 are re-solidified molten regions, crack regions, dielectric breakdown regions, or refractive index change regions or may be combined regions of such regions. The work unit WS (wafer W) having the modified regions 77 formed thereon is carried into a dividing apparatus 2 (refer to FIG. 3A).

The dividing step is carried out after the modified region forming step. As depicted in FIG. 3A, the dividing apparatus 2 is configured such that it moves an annular table 21, on which the ring frame F is supported, upwardly and downwardly relative to an expansion drum 22 to expand the dicing tape T. If a work unit WS (wafer W) is charged into the dividing apparatus 2, then the ring frame F is held on the annular table 21 by clamp units 24, and an upper end of the expansion drum 22 is positioned between the wafer W and the ring frame F. Then, the ring frame F is moved downwardly together with the annular table 21 by a lifting and lowering mechanisms 23 around the expansion drum 22 to move the expansion drum 22 upwardly relative to the annular table 21.

Figure 3B:
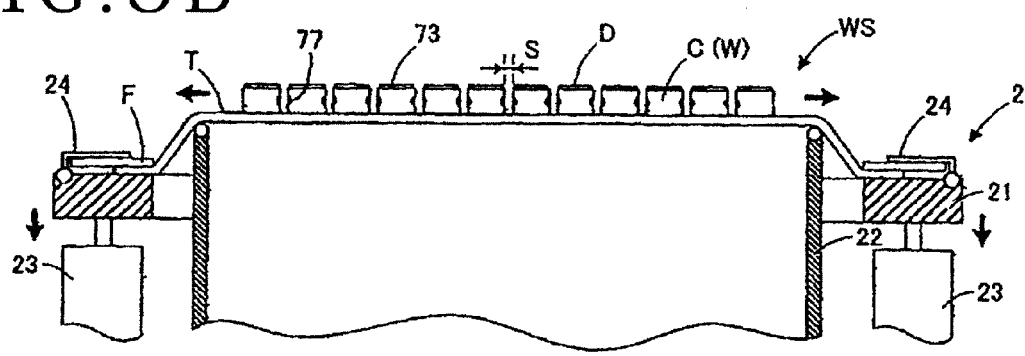
Figure 3C:
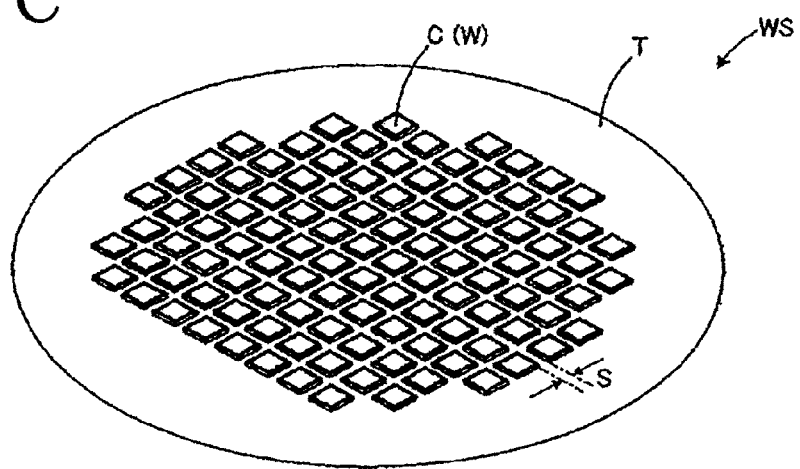
FIG. 3C is a perspective view of the work unit after the dividing step.

As a result, the dicing tape T is expanded in a radial direction as depicted in FIG. 3B, and external force is applied to the modified regions 77 of the wafer W through the dicing tape T. The wafer W is divided into individual chips C along the streets 75 beginning with division starting points given by the modified regions 77 having reduced strength. At this time, the dicing tape T is expanded to a point at which adjacent ones of the chip side faces (dividing faces) are fully spaced away from each other. Consequently, a gap S is assured between adjacent ones of the chips C. As depicted in FIG. 3C, the work unit WS (wafer W) after the division is carried into an etching apparatus 3 (refer to FIG. 4A) in a state in which the ring frame F is removed from the work unit WS.

Here, before the following steps are described, the etching apparatus is described briefly with reference to FIG. 4A. It is to be noted that, while the etching apparatus in the present embodiment is described taking an apparatus which carries out reactive gas etching as an example, any etching apparatus which carries out any of plasma etching and chemical dry etching as isotropic dry etching may be used. It is to be noted that, as the inert gas, for example, Ar, He, and $N_2$ gas are used. For example, $ClF_3$ and $XeF_2$ may be used as etching gas. Alternatively, mixture gas of $N_2$ of inert gas and $ClF_3$ of etching gas may be used.

The etching apparatus 3 is configured such that it etches chip side faces 78 after division by reactive gas etching in a state in which inert gas is filled in cracks 79 (refer to FIG. 6A and FIG. 6B) appearing on the chips C. The etching apparatus 3 includes a base 31, on which a housing 32 is provided to form an accommodation space 33. An opening and closing door 36 is attached to one side wall 34 of the housing 32 such that it opens and closes a loading opening 35 for the wafer W. A pair of lifting and lowering mechanisms 38 are attached to an upper wall 37 of the housing 32, and a movable housing 39 is supported on the pair of lifting and lowering mechanisms 38 such that it forms double processing chambers in the accommodation space 33.

The movable housing 39 has an outer housing 41 which forms a first processing chamber 42, and an inner housing 51 which partitions the first processing chamber 42 to form a second processing chamber 52 (refer to FIG. 5B). The outer housing 41 is formed in a tubular shape open at a bottom thereof and is supported on the housing 32 through the pair of lifting and lowering mechanisms 38. Since the outer housing 41 is supported at a circumferential wall 43 thereof on an upper face of the base 31 by the pair of lifting and lowering mechanisms 38, the first processing chamber 42 which is sealed is formed in the housing 32 (refer to FIG. 4B). A gas inlet port 45 is formed in an upper wall 46 of the outer housing 41 and connects to an inert gas source 44. Inert gas is introduced from the gas inlet port 45 to fill the first processing chamber 42 with the inert gas.

The inner housing 51 is formed in a tubular shape open at the bottom thereof and is supported on a pair of lifting and lowering mechanisms 47 attached to the upper wall 46 of the outer housing 41. Since a circumferential wall 53 of the inner housing 51 is contacted with the upper face of the base 31 by the lifting and lowering mechanisms 47, the second processing chamber 52 which is sealed is formed in the outer housing 41 (refer to FIG. 5B). A gas inlet port 55 is formed in an upper wall 56 of the inner housing 51 and connects to an etching gas source 54. The gas inlet port 55 is covered with a diffusion member 57, and when etching gas is introduced from the gas inlet port 55, the etching gas is diffused into the second processing chamber 52 through the diffusion member 57.

Further, a cooling passage 58 is formed in the upper wall 56 of the inner housing 51 such that cooling water passes therethrough. The cooling passage 58 configures part of a circulating passage of cooling water, and cooling water is supplied from a cooling water source 59 provided midway of the circulating passage. Since cooling water is circulated along the circulating passage, heat generated in the inner housing 51 upon etching is transmitted to the cooling water thereby to suppress an abnormal temperature rise of the inner housing 51.

On the base 31, a chuck table 61 is attached below the movable housing 39. The chuck table 61 is formed in a shape of a disk having an outer diameter smaller than the inner diameter of the circumferential wall 53. A holding face 62 is formed from a porous ceramic material on an upper face of the chuck table 61. The holding face 62 is connected to a suction source 63 through a flow passage in the chuck table 61. The wafer W is sucked and held by a negative pressure generated at the holding face 62. The chuck table 61 is accommodated in the first processing chamber 42 such that the outer housing 41 contacts with the base 31 (refer to FIG. 4B), and as the inner housing 51 contacts with the base 31, it is accommodated in the second processing chamber 52 (refer to FIG. 5B).

Further, a cooling passage 64 through which cooling water passes is formed in the chuck table 61. The cooling passage 64 configures part of a circulating passage for cooling water, and cooling water is supplied from a cooling water source 65 provided midway of the circulating passage. When cooling water circulates in the circulating passage, heat generated in the chuck table 61 upon etching is transmitted to the cooling water thereby to suppress an abnormal temperature rise of the chuck table 61. Further, on the base 31, a suction port 67 is formed so as to correspond to a location between the circumferential wall 43 and the circumferential wall 53 such that the suction port 67 connects to a vacuum source 66. When air is sucked from the suction port 67, the inside of the first processing chamber 42 is placed into a vacuum state.

In the etching apparatus 3 configured in this manner, the process charging step is carried out after the dividing step as depicted in FIG. 4A. At the process charging step, the opening and closing door 36 of the housing 32 is open, and the movable housing 39 is retracted above the chuck table 61. If a work unit WS (wafer W) divided already is charged from the loading opening 35 by a robot arm 71, then the wafer W is held on the chuck table 61 through the dicing tape T. At this time, the chips C of the wafer W are spaced by a predetermined gap S from adjacent ones of the chips C. Then, the opening and closing door 36 is closed to seal the housing 32.

After the process charging step, the vacuum step is carried out as depicted in FIG. 4B. At the vacuum step, the movable housing 39 is moved downwardly toward the base 31 by the lifting and lowering mechanisms 38. In this case, the movable housing 39 is moved down in a state in which the inner housing 51 is pulled up with respect to the outer housing 41 until the circumferential wall 43 of the outer housing 41 is contacted with the base 31. Consequently, the first processing chamber 42 is formed in the accommodation space 33, and the wafer W on the chuck table 61 is accommodated into the first processing chamber 42. Then, the air in the first processing chamber 42 is sucked out from the suction port 67 to place the inside of the first processing chamber 42 into a vacuum state.

After the vacuum step, the inert gas filling step is carried out as depicted in FIG. 5A. At the inert gas filling state, inert gas is introduced into the first processing chamber 42 in the vacuum state from the gas inlet port 45 for inert gas so that the inert gas is filled until the pressure in the first processing chamber 42 becomes a predetermined pressure (for example, 43 kPa) in a viscous flow region. Consequently, the inert gas permeates cracks 79 generated in the chip side faces 78 and is filled into the cracks 79 (refer to FIG. 6A).

After the inert gas filling step, the etching step is carried out as depicted in FIG. 5B. At the etching step, the inner housing 51 is moved down by the pair of lifting and lowering mechanisms 47 until the circumferential wall 53 of the inner housing 51 is contacted with the base 31. Consequently, the second processing chamber 52 is formed in the first processing chamber 42, and the wafer W on the chuck table 61 is accommodated into the second processing chamber 52. Into the second processing chamber 52 as a viscous flow region with the inert gas filled therein, etching gas is introduced from the gas inlet port 55. In a state in which the pressure in the second processing chamber 52 keeps the predetermined pressure in the viscous flow region, the etching gas is continuously introduced into the second processing chamber 52 until the inside of the second processing chamber 52 is filled with the mixture gas of the etching gas and the inert gas. At this time, the pressure in the second processing chamber 52 is, for example, 45.15 kPa and includes a partial pressure of 43 kPa (95%) of the inert gas and another partial pressure of 2.15 kPa (5%) of the etching gas.

Therefore, the state in which the inert gas is filled in the cracks 79 of the chip side faces 78 is maintained, and the inert gas is less likely to escape from the cracks 79. Then, the etching gas is diffused into the second processing chamber 52 by the diffusion member 57 and enters the gaps S between the chips C. Consequently, the chip side faces 78 after the division are reacted for a fixed period of time by the etching gas and consequently are removed by a fixed amount in an out-of-plane direction, namely, in a perpendicular direction to the chip side faces 78 (refer to FIG. 6B). For example, by the reaction for 30 seconds to 300 seconds, the chip side faces 78 are etched by 2 μm to 10 μm.

Consequently, the modified regions 77 and broken pieces having remained on the chip side faces 78 are removed and the cracks 79 are reduced. Therefore, the performance of the devices does not suffer from a bad influence of such broken pieces, cracks 79 and so forth of the modified regions 77. Further, since the etching is carried out in the state in which inert gas is filled in the cracks 79, the etching gas does not penetrate into the cracks 79 at all and the cracks 79 are not grown by the etching. Further, where the configuration that the second processing chamber 52 is formed in the first processing chamber 42 is employed, the charging amount of etching gas can be suppressed.

In this manner, with the dividing method for a wafer W according to the present embodiment, modified regions 77 are formed in the inside of the wafer W along streets 75, and the wafer W is divided into individual chips C beginning with starting points given by the modified regions 77. Then, after the wafer W is charged into the first processing chamber 42, the inside of the first processing chamber 42 is placed into a vacuum state and inert gas is introduced into the first processing chamber 42. Consequently, the inert gas is filled into cracks 79 existing on chip side faces 78 produced upon division. Further, the second processing chamber 52 is formed in the inside of the first processing chamber 42, and etching gas is additionally introduced into the second processing chamber 52. Consequently, the chip side faces 78 are etched in a state in which the inert gas stays in the cracks 79. Therefore, the etching gas does not penetrate into the cracks 79 and the etching progresses in an inward direction (out-of-plane direction) from the chip side faces 78. Consequently, the modified regions 77 and broken pieces remaining on the chip side faces 78 can be removed while the growth of the cracks 79 is suppressed.

It is to be noted that the present invention is not limited to the embodiment described above, but it is possible to carry out the present invention in variously altered modes. In the embodiment described above, the size, shape and so forth depicted in the accompanying drawings are not limited specifically but can be altered suitably within a range within which the effects of the present invention are achieved. Further, the present invention can be carried out in suitably modified forms without departing from the scope of the object of the present invention.

For example, the embodiment described above is configured such that the second processing chamber 52 is formed in the first processing chamber 42 and the inert gas filling step is carried out in the first processing chamber 42 and then the etching step is carried out in the second processing chamber 52. However, the present invention is not limited to this configuration. The embodiment may be configured otherwise such that the inert gas filling step and the etching step are carried out in the same processing chamber. In this instance, there is no necessity to form the second processing chamber 52 in the first processing chamber 42, and therefore, it is possible to simplify the apparatus configuration.

Further, in the embodiment described above, the pressure in the first processing chamber 42 at the inert gas filling step is 43 kPa and the pressure in the second processing chamber 52 at the etching step is 45.15 kPa. However, the present invention is not limited to this configuration if the pressure in both of the first processing chamber 42 and the second processing chamber 52 can keep the viscous flow region. The pressure in the first and second processing chambers 42 and 52 is not limited particularly, but the pressure in the first processing chamber 42 into which inert gas has been introduced may be 1 to 50 kPa, and the partial pressure of etching gas may be 1 to 10 kPa while the pressure in the second processing chamber 52 by inert gas and etching gas is 2 to 60 kPa. Preferably, the partial pressure of the etching gas is 2 to 3 kPa.

Further, at the process charging step in the embodiment described above, a work unit WS is carried into the etching apparatus 3 in a state in which the ring frame F is removed. However, the process charging step is not limited to the configuration just described. The process charging step may be configured otherwise such that a work unit WS is carried into the etching apparatus 3 in a state in which the ring frame F is attached.

Further, the dividing step of the embodiment described above is configured such that the wafer W is divided by expanding the dicing tape T. However, the dividing step is not limited to the configuration just described. At the dividing step, only it is necessary that the wafer W can be divided from a dividing point given as a modified region 77, and the dividing method at the dividing step is not limited to that by tape expansion. At the dividing step, the wafer W may be divided by breaking using a pressing blade. Alternatively, the wafer W may be divided by applying a grinding load to the modified regions 77 by DBG (Dicing Before Grinding). In the case of the DBG, at the modified region forming step, a laser beam is irradiated while it is focused within the range of the finish thickness of the chips C. Where the wafer W is divided by breaking and DBG, tape expansion is carried out later to widen the distance between chips.

As described above, the present invention has an effect that modified regions and broken pieces remaining on chip side faces can be removed while growth of a crack is suppressed, and is particularly useful to a dividing method for a wafer wherein a semiconductor wafer is divided along a street.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A dividing method for a wafer, comprising:

a modified region forming step of irradiating, on a work unit including a dicing tape pasted to a wafer having a plurality of devices formed in a state partitioned from each other by streets on a surface thereof, a laser beam having a wavelength which passes through the wafer along the streets to form modified regions in an inside of the wafer;

a dividing step of applying external force to the work unit after the modified region forming step to divide the wafer into a plurality of device chips along the streets beginning with starting points given by the modified regions and securing a distance between the chips;

a work unit introducing step for introducing the work unit after having been divided into the chips by the dividing step into a processing chamber and sealing the processing chamber;

a vacuum step of placing the processing chamber into which the work unit has been introduced and which has been sealed into a vacuum state; and an inert gas filling step of introducing inert gas into the processing chamber which has been placed into a vacuum state by the vacuum step to fill the processing chamber with the inert gas by a predetermined pressure and filling the inert gas into cracks existing on chip side faces formed by the dividing step by the pressure of the inert gas; followed by an etching step of additionally introducing etching gas into the processing chamber which has been filled with the inert gas at the inert gas filling step to perform reactive gas etching for the side faces of the individually divided chips.

2. The dividing method for the wafer according to claim 1, wherein the processing chamber is configured to include a first processing chamber in which the vacuum step and the inert gas filling step are performed in a sealed space and a second processing chamber in which the etching step is performed in a sealed space formed by partitioning the first processing chamber.

* * * * *